US010790363B2

(12) United States Patent
Economikos et al.

(10) Patent No.: US 10,790,363 B2
(45) Date of Patent: Sep. 29, 2020

(54) IC STRUCTURE WITH METAL CAP ON COBALT LAYER AND METHODS OF FORMING SAME

(71) Applicant: GLOBALFOUNDRIES INC., Grand Cayman (KY)

(72) Inventors: Laertis Economikos, Wappingers Falls, NY (US); Kevin J. Ryan, Albany, NY (US); Ruilong Xie, Schenectady, NY (US); Hui Zang, Guilderland, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 16/054,033

(22) Filed: Aug. 3, 2018

(65) Prior Publication Data

US 2020/0044034 A1    Feb. 6, 2020

(51) Int. Cl.
| | |
|---|---|
| *H01L 29/40* | (2006.01) |
| *H01L 29/78* | (2006.01) |
| *H01L 29/06* | (2006.01) |
| *H01L 21/3213* | (2006.01) |
| *H01L 29/45* | (2006.01) |
| *H01L 29/66* | (2006.01) |

(52) U.S. Cl.
CPC ...... *H01L 29/401* (2013.01); *H01L 21/32133* (2013.01); *H01L 29/0649* (2013.01); *H01L 29/45* (2013.01); *H01L 29/66795* (2013.01); *H01L 29/785* (2013.01)

(58) Field of Classification Search
CPC ......... H01L 29/66545; H01L 21/76897; H01L 29/66795; H01L 29/785; H01L 23/535; H01L 29/41791
USPC .................. 438/592, 655; 257/288, 369, 506
See application file for complete search history.

(56) References Cited

U.S. PATENT DOCUMENTS

| | | | |
|---|---|---|---|
| 2016/0225667 A1* | 8/2016 | Zang | H01L 29/4991 |
| 2017/0110549 A1* | 4/2017 | Xie | H01L 29/41766 |
| 2017/0186849 A1* | 6/2017 | Chen | H01L 29/6656 |

FOREIGN PATENT DOCUMENTS

| | | |
|---|---|---|
| CN | 107075310 A | 8/2017 |
| JP | 6227440 B2 | 11/2017 |

* cited by examiner

*Primary Examiner* — Jonathan Han
(74) *Attorney, Agent, or Firm* — Francois Pagette; Hoffman Warnick LLC

(57) ABSTRACT

The disclosure relates to methods of forming integrated circuit (IC) structures with a metal cap on a cobalt layer for source and drain regions of a transistor. An integrated circuit (IC) structure according to the disclosure may include: a semiconductor fin on a substrate; a gate structure over the substrate, the gate structure having a first portion extending transversely across the semiconductor fin; an insulator cap positioned on the gate structure above the semiconductor fin; a cobalt (Co) layer on the semiconductor fin adjacent to the gate structure, wherein an upper surface of the Co layer is below an upper surface of the gate structure; and a metal cap on the Co layer.

19 Claims, 13 Drawing Sheets

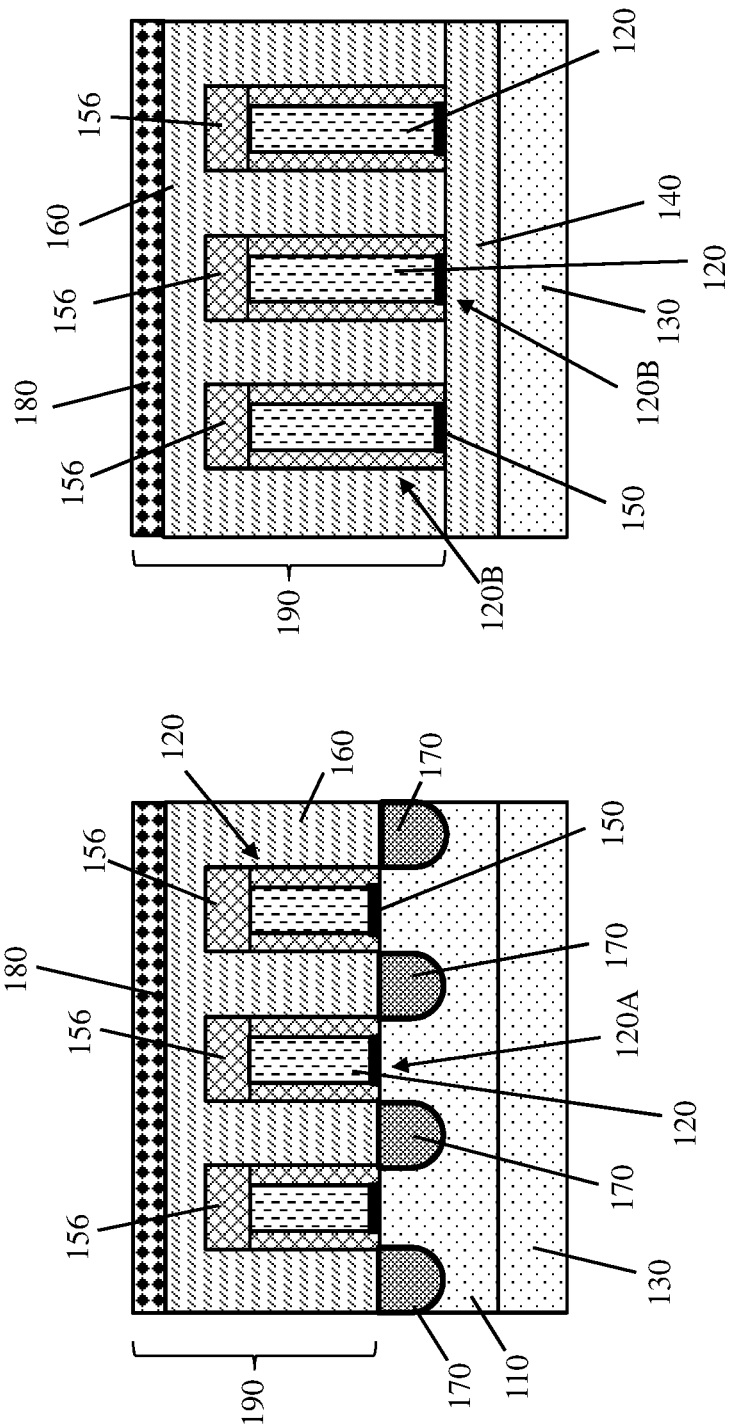

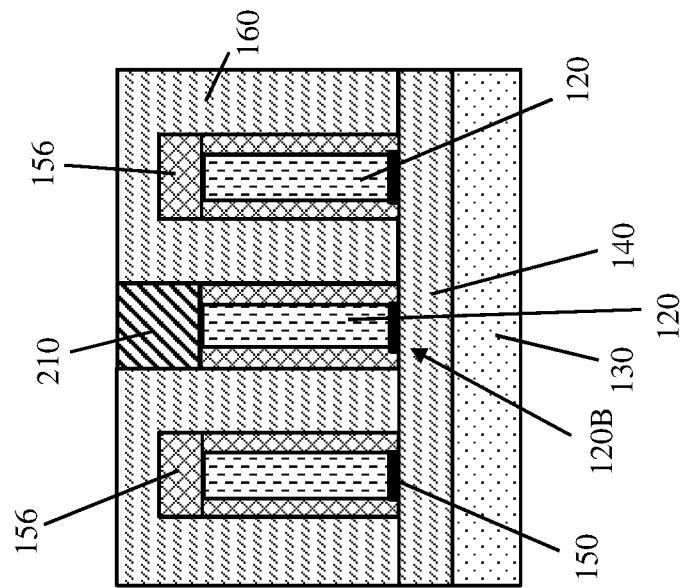
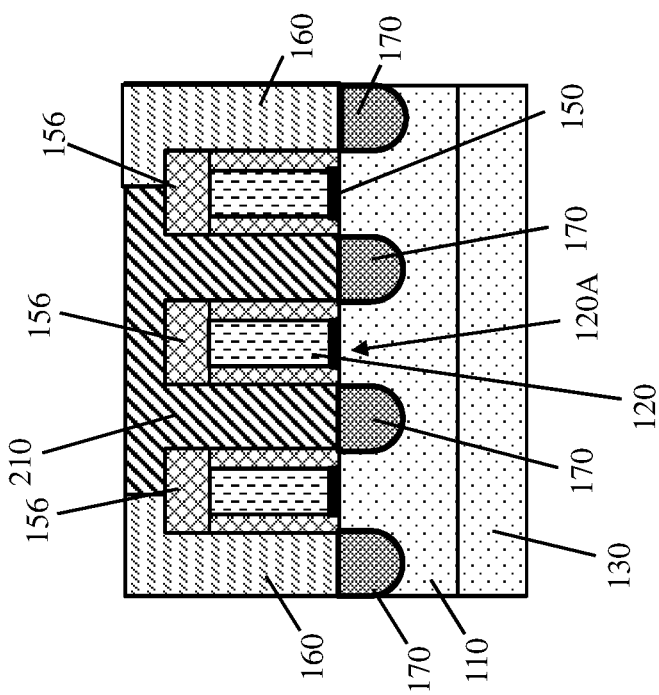
FIG. 13
FIG. 12

IC STRUCTURE WITH METAL CAP ON COBALT LAYER AND METHODS OF FORMING SAME

BACKGROUND

Technical Field

The present application relates to methods of forming an integrated circuit (IC) structure, and structures associated with the disclosed methods. More particularly, the present application relates to forming IC components, e.g., transistors, in which overlying materials protect a cobalt layer from subsequent etching and processing.

Related Art

Design systems are commonly used to create integrated circuits (ICs) and, in particular, to design front end of line (FEOL) components, e.g., transistors for providing active electrical functions of a device. As advances occur, smaller widths for wires and vias are provided. Additional design constrains imposed by smaller wire and via widths, e.g., requirements for uni-directional wiring at any metal layer, may create manufacturing challenges. The intended circuit structure must comply with several design rules before manufacture. Design rule spacing constraints can limit a variety of attributes, e.g., the maximum separation distance between adjacent gates in a cell array. Such constraints can affect the ability to form functional elements which connect gates and/or other structures together, e.g., two or more vias connecting to nearby positions of a single device layer, as well as the materials which may be used to form conductive components of a transistor. Under these circumstances, some materials may be more desirable than others in the final design structure. Some desirable materials, e.g., metals such as cobalt, may be difficult to incorporate into existing processes due to the risk of erosion or contamination.

The forming of transistor structures in FEOL processing generally includes various phases of chemical mechanical planarization (CMP). Materials included in a CMP slurry may erode any exposed materials on a partially-formed transistor structure. Erosion may be intentional in the case of exposed layers to be planarized. Other exposed materials, however, may inadvertently erode upon contact with the slurry. Conductive metals and/or dielectric materials intended for use in the eventual structure may be susceptible to unintended erosion, material migration, etc., during CMP. When metals and/or dielectric materials erode, they may become non-compliant with design requirements for the FEOL structures that are being formed. Non-compliance with design requirements may have operating consequences, e.g., electrical shorting at various portions of a transistor structure.

SUMMARY

A first aspect of the disclosure provides an integrated circuit (IC) structure including: a semiconductor fin on a substrate; a gate structure over the substrate, the gate structure having a first portion extending transversely across the semiconductor fin; an insulator cap positioned on the gate structure above the semiconductor fin; a cobalt (Co) layer on the semiconductor fin adjacent to the gate structure, wherein an upper surface of the Co layer is below an upper surface of the gate structure; and a metal cap on the Co layer.

A second aspect of the disclosure provides a method of forming an integrated circuit (IC) structure, the method including: forming an insulator on a structure, the structure including: a semiconductor fin on a substrate, a shallow trench isolation (STI) laterally adjacent to the semiconductor fin, and a gate structure over the substrate, the gate structure having a first portion extending transversely across the semiconductor fin and a second portion extending transversely across the STI; forming a first opening in the insulator to expose the semiconductor fin and the first portion of the gate structure; forming a second opening in the insulator to expose the second portion of the gate structure, wherein a portion of the insulator separates the first opening from the second opening; forming a cobalt (Co) layer on the semiconductor fin adjacent to the first portion of the gate structure, wherein an upper surface of the Co layer is below an upper surface of the gate structure; forming a metal within the first and second openings, wherein the metal within the first opening forms a metal cap on the Co layer, and the metal within the second opening forms an overlying gate metal on the second portion of the gate structure; forming a first contact to the metal cap; and forming a second contact to the overlying gate metal.

A third aspect of the disclosure provides a method of forming an integrated circuit (IC) structure, the method including: forming an insulator on a structure, the structure including: a semiconductor fin on a substrate, a shallow trench isolation (STI) laterally adjacent to the semiconductor fin, and a gate structure over the substrate, the gate structure having a first portion extending transversely across the semiconductor fin and a second portion extending transversely across the STI; forming a first opening in the insulator to expose the semiconductor fin and the first portion of the gate structure; forming a second opening in the insulator to expose the second portion of the gate structure, wherein a remaining portion of the insulator separates the first opening from the second opening; depositing a bulk Cobalt (Co) layer within the first and second openings; selectively etching the bulk Co layer to form a Co layer on the semiconductor fin, wherein the selective etching removes the bulk Co layer from the second opening and recesses the bulk Co layer below an upper surface of the gate structure, wherein a Co residue remains on the upper surface of the gate structure after the selective etching; forming a metal within the first and second openings, wherein the metal within the first opening forms a metal cap on the Co layer, and the metal within the second opening forms an overlying gate metal on the second portion of the gate structure; recessing the metal to expose the Co residue on the upper surface of the gate structure; removing the Co residue; forming a first contact to the metal cap; and forming a second contact to the overlying gate metal.

BRIEF DESCRIPTION OF THE DRAWINGS

The embodiments of this disclosure will be described in detail, with reference to the following figures, wherein like designations denote like elements, and wherein:

FIG. 4 shows, along the first cross-section, forming an organic planarization layer (OPL) on the structure to form a mask according embodiments of to the disclosure.

FIG. 5 shows, along the second cross-section, forming an OPL on the structure to form a mask according to embodiments of the disclosure.

FIG. 12 shows, along the first cross-section, stripping the OPL and filling the first opening with a cobalt layer according to embodiments of the disclosure.

FIG. 13 shows, along the second cross-section, stripping the OPL and filling the second opening with a cobalt layer according to embodiments of the disclosure.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific illustrative embodiments in which the present teachings may be practiced. These embodiments are described in sufficient detail to enable those skilled in the art to practice the present teachings and it is to be understood that other embodiments may be used and that changes may be made without departing from the scope of the present teachings. The following description is, therefore, merely illustrative.

Figure 1:
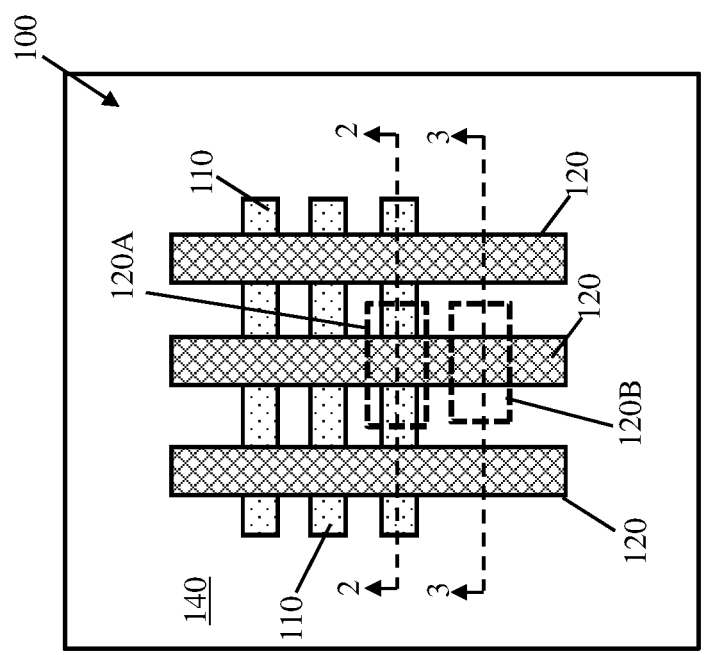
FIG. 1 shows a plan view of an initial structure to be processed according to embodiments of the disclosure.

FIG. 1 provides a plan view of a structure 100 to be processed according to embodiments of the disclosure. The example structure 100 of FIG. 1 provides one preliminary set of materials targeted for use with embodiments of the disclosure, but it is understood that embodiments of the disclosure may be implemented on different designs without significant changes to the various example techniques discussed herein. Structure 100 can include a set (i.e., one or more) of fins 110 extending in parallel with each other, with three fins 110 being provided as an example. Structure 100 may also include a set (i.e., one or more) gate structures 120 extending transversely over fins 110. A shallow trench isolation 140 (shown without cross-hatching in FIG. 1 solely for clarity) of structure 100, may be positioned underneath and/or adjacent to fin(s) 110 and gate structure(s) 120. Gate structure(s) 120 may be subdivided into a first portion 120A and a second portion 120B. First portion 120A indicates a portion of gate structure 120 positioned over corresponding fin(s) 110 in structure 100. Second portion 120B indicates a portion of gate structure(s) 120 positioned over STI(s) 140. In some cases, first portion 120A of gate structure 120 may be known as a "source drain contact area" while second portion 120B of gate structure 120 may be known as a "gate contact area." Gate structure(s) 120 may be structurally continuous and identical in composition through first and second portions 120A, 120B, with the sole distinction between each portion being its location over semiconductor fin(s) 110 or STI(s) 140. It is also understood that first and second portions 120A, 120B may be horizontally separated with respect to each other as shown in FIG. 1. Further illustration of methods according to the disclosure is provided by reference to a first lateral cross-section of FIG. 1 along line 2-2, depicted in even-numbered FIGS. 4, 6, 8, 10, etc., and a second lateral cross-section of FIG. 1 along line 3-3, depicted in odd-numbered FIGS. 5, 7, 9, 11, etc. It should be emphasized that fins 110 are absent from structure 100 along the second lateral cross-section.

Figure 3:
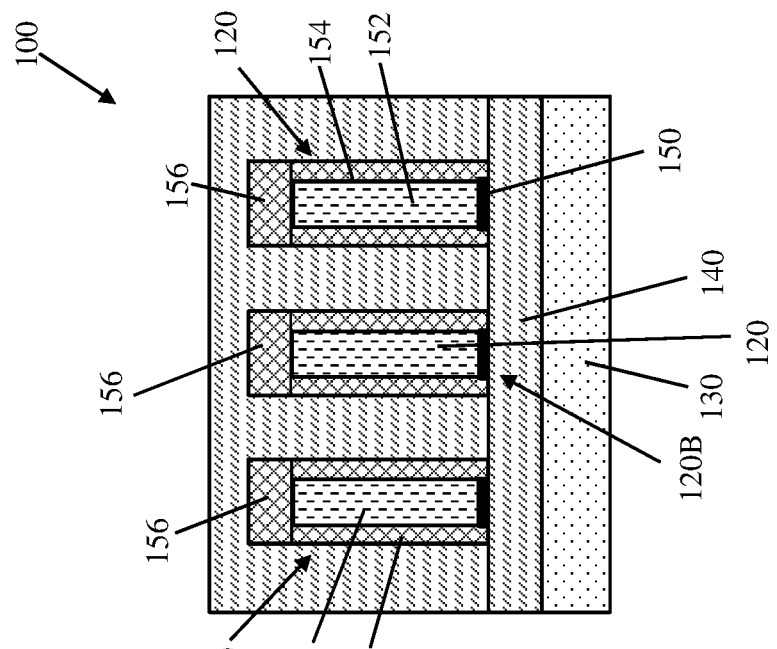
FIG. 3 shows a second cross-sectional view, along line 3-3 of FIG. 1, of forming a mask on the structure according to embodiments of the disclosure.
Figure 2:
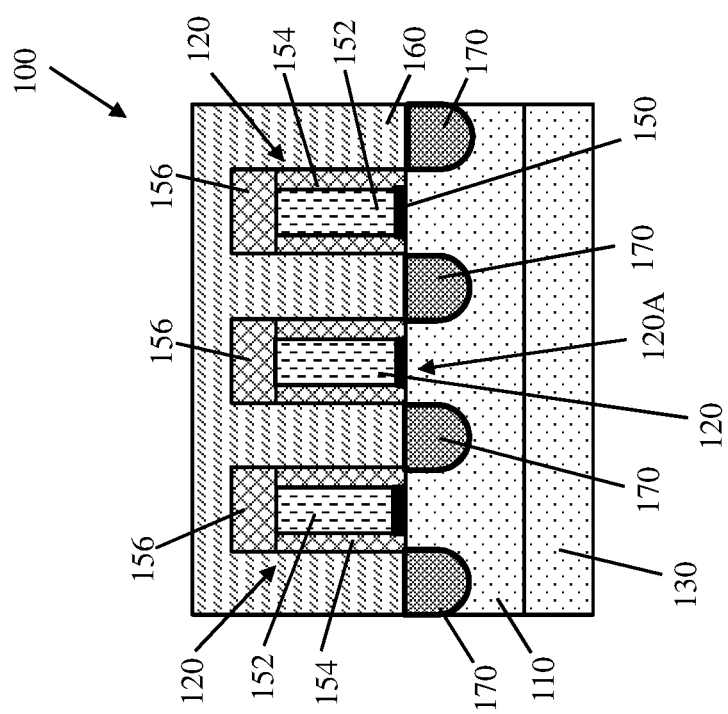
FIG. 2 shows a first cross-sectional view, along line 2-2 of FIG. 1, of forming a mask on the structure according to embodiments of the disclosure.

Referring to FIGS. 2-3, together, methods according to the disclosure may include forming various masking materials on structure 100. Each fin 110 may be formed from an underlying semiconductor substrate 130, e.g., by removing targeted portions of substrate 130 to a predetermined depth, causing the non-removed portions to form fins 110 directly on substrate 130. Substrate 130 may include, e.g., one or more currently-known or later developed semiconductive substances generally used in semiconductor manufacturing, including without limitation: silicon (e.g., crystal silicon), germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity).

Structure 100 may include at least one shallow trench isolation (STI) 140 positioned on substrate 130, as well as between fins 110 and gate structures 120. Each STI 140 may be formed of any currently-known or later developed substance for providing electrical insulation, and as examples may include: silicon nitride ($Si_3N_4$), silicon oxide ($SiO_2$), fluorinated $SiO_2$ (FSG), hydrogenated silicon oxycarbide (SiCOH), porous SiCOH, boro-phospho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, a spin-on silicon-carbon containing polymer material, near frictionless carbon (NFC), or layers thereof.

Each gate structure 120 may lack one or more functional components used in a complete IC structure, and may include one or more dummy gates to be processed at a different stage of forming a product. Such components may be eventually replaced with functional elements in other process steps. Gate structures 120 thus may cover one or more semiconductor fins 110 positioned above substrate 130, e.g., by coating exposed sidewalls and an upper surface of fin(s) 110. Gate structures 120 may include multiple subcomponents. For example, each gate structure 120 may include a gate dielectric film 150 on an upper surface of semiconductor fin 110. A gate metal 152 of gate structure 120 may be on gate dielectric film 150 to provide an electrically conductive portion of a transistor gate. Gate metal 152 may include one or more metals acceptable for use in a transistor gate. Gate structure(s) 120 may also include gate spacers 154 positioned on vertical sidewalls of gate metal 152. Gate spacer(s) 154 may be provided as one or more bodies of insulating material formed on exposed portions of STI(s) 140 and/or gate structure(s) 120, e.g., by deposition, thermal growth, etc. Gate spacer(s) 154 may include materials and/or other structures formed on or adjacent to gate structure(s) 120 to electrically and physically separate gate structure(s) 120 from other components of structure 100. In an example embodiment, gate spacer(s) 154 may be provided as a region of silicon nitride (SiN) with or without other insulating materials being included therein. An insulator cap 156 may be formed on gate structure 120 to cover gate metal 152 and gate spacers 154. Insulator cap 156 may have the same material composition as gate spacers 154, and in an example embodiment may include silicon nitride (SiN), other nitride materials, and/or more generally may include other currently known or later developed insulating materials.

A first process according to the disclosure may including forming an oxide 160 on structure 100, i.e., over substrate 130, fin(s) 10, STI(s) 140, and gate structure(s) 120. Oxide 160 may be formed by non-selective or selective deposition, such that oxide 160 initially covers at least fin(s) 110 and gate structure(s) 120. Oxide 160 may include one or more of the oxide materials listed as example materials for STI(s) 140, including one or more flowable oxide materials, or it may include a different oxide material. STI(s) 140 and oxide 160 are shown as different components, e.g., due to STI(s) 140 being formed before gate structure(s) 120, and oxide 160 being contemporaneously formed on fin(s) 110, gate structure(s) 120, and STI(s) 140.

As shown specifically in FIG. 2, each fin 110 may include a set of epitaxial regions 170 positioned below oxide 160 and adjacent to first portion 120A of gate structure(s) 120. Epitaxial regions 170 may be formed within fin 110, e.g., by forming openings within fin 110 and epitaxially growing another semiconductor material within the openings, thereby forming epitaxial regions 170 with a different material composition from the remainder of fin 110. Gate spacers 154 and insulator caps 156 may shield a portion of the fin 110 when epitaxial regions 170 are being formed. Epitaxial regions 170 may include the same semiconductor material of fin 110, or a different semiconductor material, but with dopants therein. Introducing dopants into epitaxial regions 170 may form the eventual source/drain regions of a device formed from structure 100. Epitaxial regions 170, after being doped, may have a different composition from the remainder of fin 110. To form epitaxial regions 170, selected portions of fin 110 may be implanted with a strain-inducing material, such as silicon germanium or silicon carbon, formed on fins composed of silicon, silicon germanium, and/or silicon carbon. The dopants used to form epitaxial regions 170 may be introduced in situ or an implantation process may be performed to affect only epitaxial regions 170 of structure 100. According to an example, fin 110 is not previously doped before epitaxial regions 170 are formed within structure 100. A doping process may be performed to dope fin(s) 110 and epitaxial regions 170. If a lightly doped source/drain region is desired, the doping can occur after forming gate structures 120, but before forming gate spacer(s) 154 and/or insulator cap(s) 156.

Turning to FIGS. 4 and 5, additional materials may be formed on oxide 160 to prepare the materials thereunder for other processes, e.g., the forming of multiple openings as discussed elsewhere herein. Embodiments of the disclosure may include forming an organic planarization layer (OPL) 180 on oxide 160, such that OPL 180 covers oxide 160. A "planarizing layer" generally refers to any material formed on a surface to produce a planar surface, and can be formed by, e.g., the deposition of material followed by polishing, deposition followed by the forming of a flowable oxide material thereon, deposition alone, and/or any other currently known or later developed process or combination of processes. OPL 180 may include one or more carbon films removable by wet and/or dry etching processes. OPL 180 may be formed by blanket depositing of OPL 180 over each exposed structural element, and then etching OPL 180 back to a desired height above oxide 160. Together, oxide 160 and OPL 180 may define a mask 190 (FIGS. 6-7) formed on structure 100 (FIGS. 1-3) suitable to prepare structure 100 for subsequent processing.

Figures 6, 7:
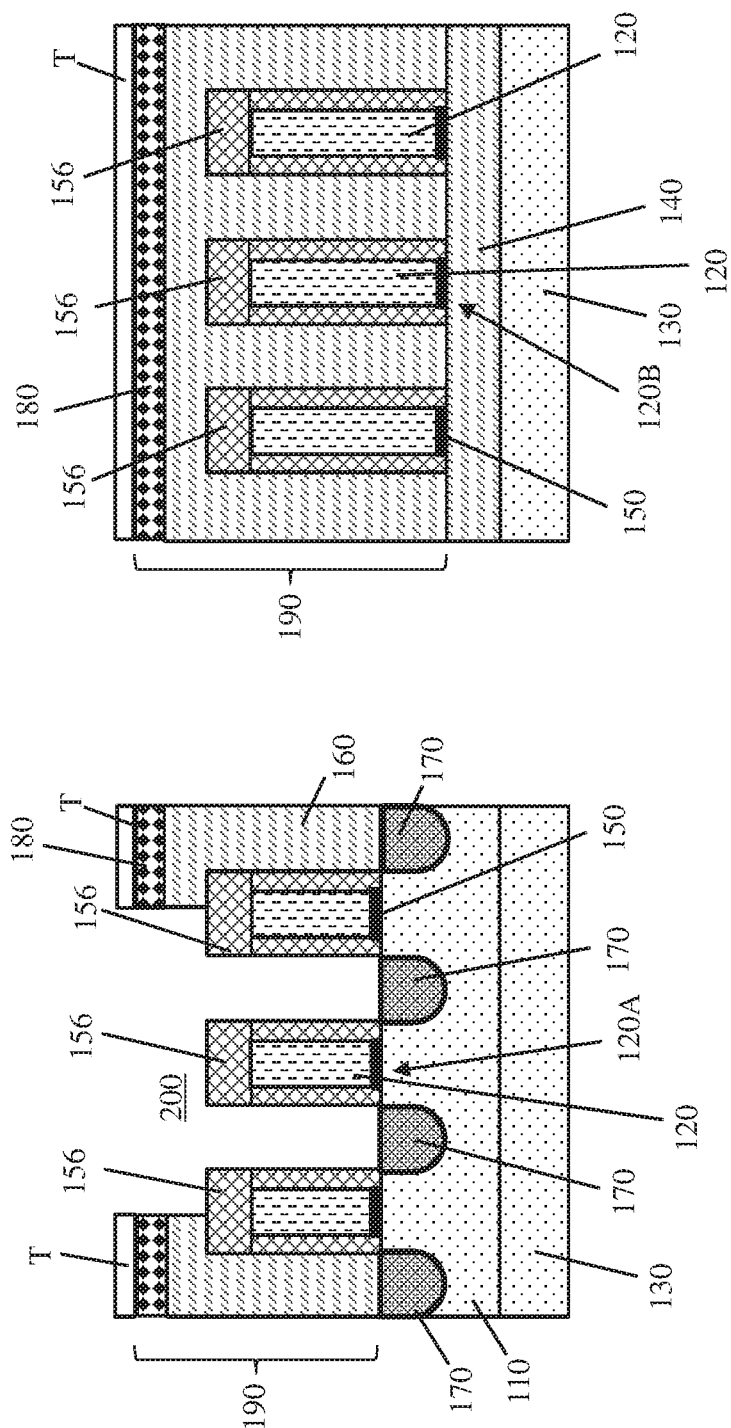
FIG. 6 shows, along the first cross-section, forming a precursor opening within the mask according to embodiments of the disclosure.
FIG. 7 shows, along the second cross-section, the second portion of the structure while forming a precursor opening within the mask according to embodiments of the disclosure.

Referring to FIGS. 6 and 7, continued processing according to the disclosure may include further modifying of mask 190 in preparation for future metal depositing operations. FIG. 6 depicts a process to form a precursor opening 200 within oxide 160 to expose fin(s) 110 and first portion 120A of gate structure(s) 120. To form precursor opening 200, a portion of oxide 160 (and overlying portions of OPL 180, where applicable) may be targeted for removal by forming a temporary mask T above selected portions of mask T. Temporary mask T may include an opening with approximately the same width as precursor opening 200 to be formed within oxide 160. Oxide 160 and overlying portions of OPL 180 may then be etched by way of a downward directional etch, or alternatively by way of an etchant selective to oxide 160 and OPL 180. Etching generally refers to the removal of material from a substrate (or structures formed on the substrate), and is often performed with a mask in place so that material may selectively be removed from certain areas of the substrate, while leaving the material unaffected in other areas of the substrate. There are generally two categories of etching, (i) wet etch, and (ii) dry etch. Wet etch is performed with a solvent (such as an acid or a base) which may be chosen for its ability to selectively dissolve a given material (such as oxide), while, leaving another material (such as polysilicon or nitride) relatively intact. This ability to selectively etch given materials is fundamental to many semiconductor fabrication processes. A wet etch will generally etch a homogeneous material (e.g., nitride) isotopically, but a wet etch may also etch single-crystal materials (e.g. silicon wafers) anisotopically. Dry etch may be performed using a plasma. Plasma systems can operate in several modes by adjusting the parameters of the plasma. Ordinary plasma etching produces energetic free radicals, neutrally charged, that react at the surface of the wafer. Since neutral particles attack the wafer from all angles, this process is isotopic. Ion milling, or sputter etching, bombards the wafer with energetic ions of noble gases which approach the wafer approximately from one direction, and therefore this process is highly anisotopic. Reactive-ion etching (RIE) operates under conditions intermediate between sputter and plasma etching and may be used to produce deep, narrow features, such as STI trenches. In any case, precursor opening 200 may be formed over fin(s) 110 and first portion 120A of gate structure(s) 120, without affecting second portion 120B of gate structure(s) 120 and oxide 160 over STI 140, e.g., based on the design of temporary mask T. Although FIG. 6 shows an example of exposing one gate structure 120 on semiconductor fin 110, it is understood that multiple gate structures 120 on semiconductor fin 110 may be exposed in further embodiments.

Figure 9:
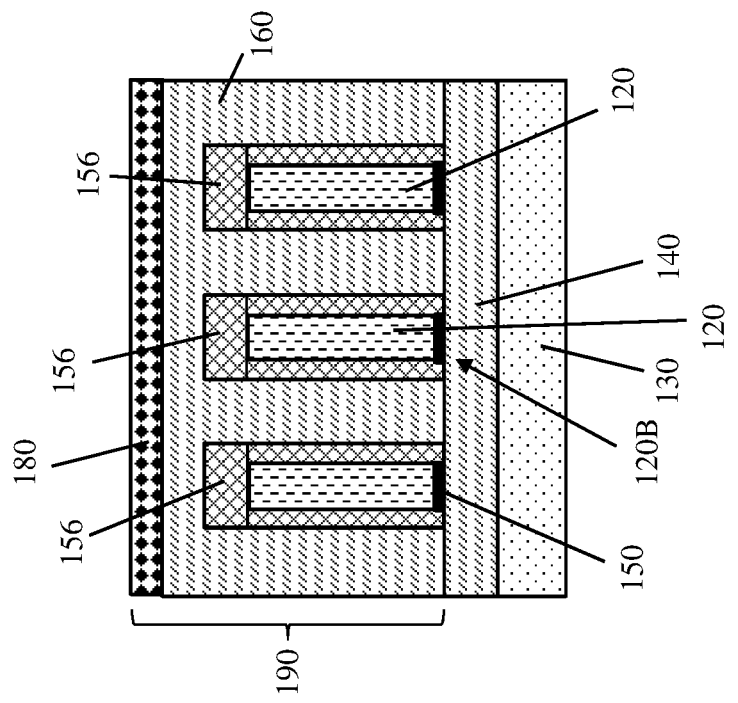
FIG. 9 shows, along the second cross-section, the second portion of the structure while filling the precursor opening with OPL material according to embodiments of the disclosure.
Figure 8:
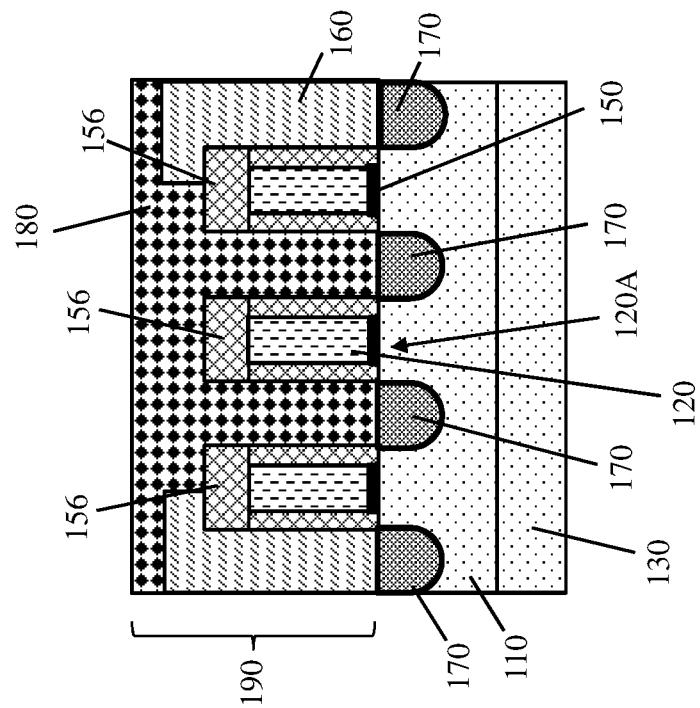
FIG. 8 shows, along the first cross-section, filling the precursor opening with OPL material according to embodiments of the disclosure.

Continuing to FIGS. 8 and 9, the disclosure may include filling precursor opening 200 (FIG. 7) with additional OPL 180. The additionally formed OPL 180 may be positioned directly on fin(s) 110 and first portion 120A of gate structure(s) 120. Due to the absence of openings over STI(s) 140 and gate structure(s) 120, OPL 180 may continue to exhibit the same thickness over gate structure(s) 120 as shown in FIG. 9. In some cases, the additionally formed OPL 180 may have a same or different material composition as compared to previously formed OPL 180. Forming additional OPL 180 adjacent to first portion 120A of gate structure(s) 120 on fin(s) 110 may allow first portion 120A of gate structure 120 to be processed differently from second portion 120B of the same gate structure 120.

Figure 11:
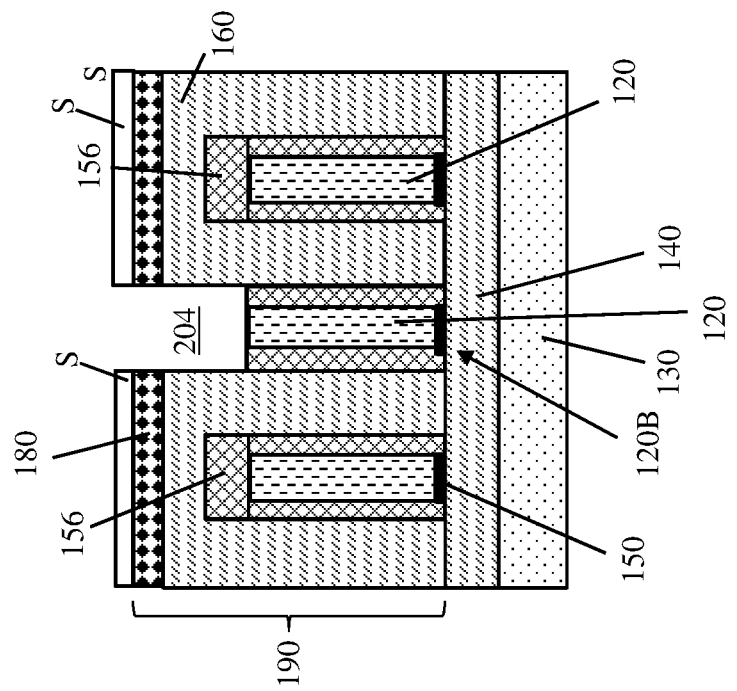
FIG. 11 shows, along the second cross-section, forming a second opening above a gate contact region according to embodiments of the disclosure.
Figure 10:
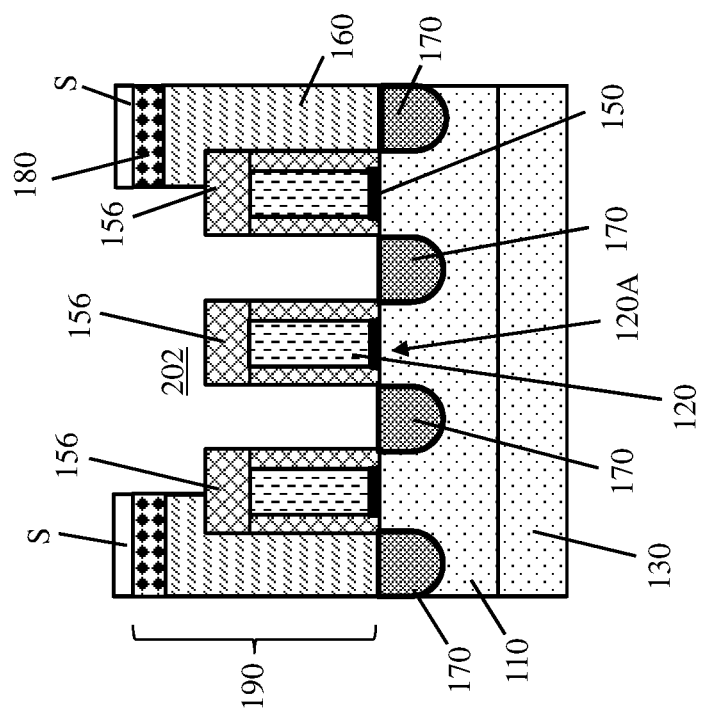
FIG. 10 shows, along the first cross-section, the structure while forming a first opening over the gate structure and substrate according to embodiments of the disclosure.

Referring to FIGS. 10 and 11, further processing may include forming openings over each portion 120A, 120B of gate structure 120. FIG. 10 depicts forming a first opening 202 within insulator 190 over first portion 120A of gate structure(s) 120. FIG. 11 depicts forming a second opening 204 within insulator 190 over second portion 120B of gate structure(s) 120. Each opening 202, 204 may be formed by etching or non-selective etching, simultaneously and/or sequentially by any currently known or later developed technique to form openings in oxide 160 and/or OPL 180. In an embodiment, second opening 204 may be formed by targeted etching of oxide 160, OPL 180, and insulator cap 156 over gate structure 120, followed by stripping of the remaining OPL 180 to form first opening 202. According to another example, a temporary mask S may be formed on OPL 180, and openings 202, 204 may then be formed by a directional downward etch (e.g., RIE) of oxide 160, OPL 180, and insulator cap 156 (over gate structure 120 only) to form openings 202, 204 in areas not covered by temporary mask S. In any case, first opening 202 may expose an upper surface and sidewalls of first portion 120A of gate structure(s) 120 and insulator cap 156 thereon. Second opening 204 by contrast may be formed to expose an upper surface of second portion 120B of gate structure(s) 120 beneath oxide 160.

Turning to FIGS. 12 and 13, embodiments of the disclosure differ from conventional FEOL components by including cobalt (Co) as a conductor to source or drain regions of a FinFET transistor. Conventional structures and processing techniques have proven ineffective for creating a viable transistor structure which includes Co for electrically connecting source or drain regions to overlying wires or vias. As noted previously, planarization slurries and/or similar substances in conventional processing may affect metals, dielectrics, etc., designed for use in the final structure. Co is one type of metal which may be removed or contaminated by etching, planarization, or other processes during manufacture. In methods according to the disclosure, Co is formed on portions of a transistor and subsequently covered with a metal cap. The metal cap may protect the previously formed Co from being removed, contaminated, etc., when remaining portions of a FinFET transistor are formed. Forming a metal cap as discussed herein protects underlying Co without affecting other processing steps to form a transistor, e.g., gate contacts or regions which do not include Co.

The previously-formed openings 202, 204 may be filled with a bulk Co layer 210, e.g., through the use of metal deposition. Bulk Co layer 210 may initially fill the space previously included in openings 202, 204 to approximately the height of remaining oxide 160, and in any case may cover the previously-exposed gate structure(s) 120 (e.g., at each portion 120A, 120B). Bulk Co layer 210 may initially be positioned above oxide 160, before being planarized to approximately the height of oxide 160. As shown specifically in FIG. 13, bulk Co layer 210 may initially contact and overlie second portion 120B of gate structure(s) 120, previously covered by insulator cap 156. Due to the differences in size and shape of each previously-formed opening 202, 204, bulk Co layer 210 may contact semiconductor fin(s) 110 adjacent to first portion 120A, without contacting semiconductor fin(s) 110 adjacent to second portion 120B.

Figure 15:
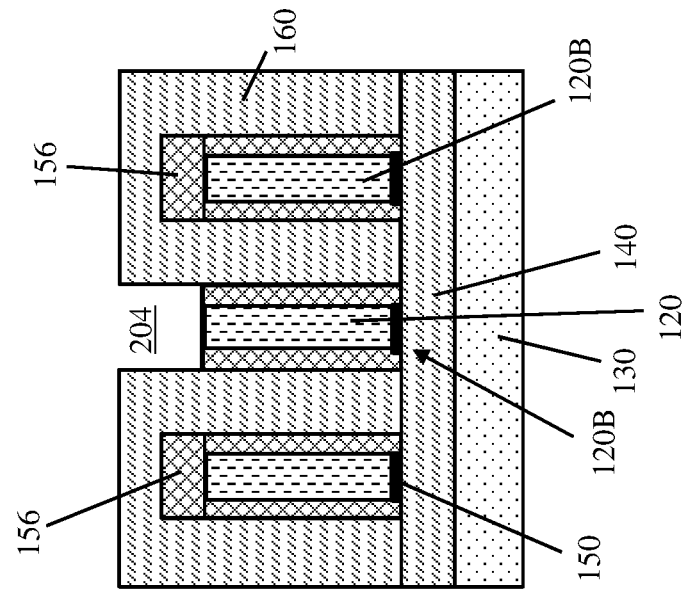
FIG. 15 shows, along the second cross-section, removing the cobalt layer from the second opening according to embodiments of the disclosure.
Figure 14:
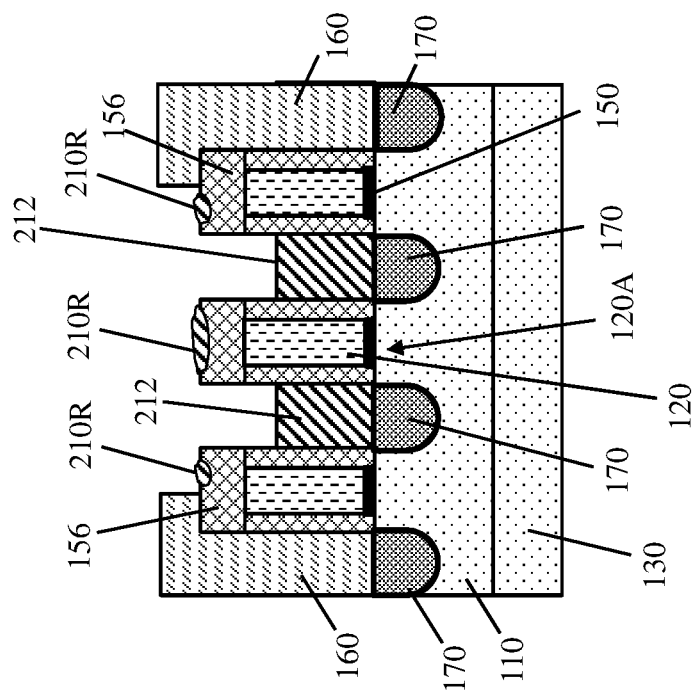
FIG. 14 shows, along the first cross-section, recessing the cobalt layer within the first opening according to embodiments of the disclosure.

Turning now to FIGS. 14 and 15, bulk Co layer 210 (FIGS. 12, 13) may be selectively etched to form the shape of a cobalt layer for a source or drain region of a transistor. The previously-formed bulk Co layer 210 may be etched using one or more wet etchants selective to metals, leaving oxide 160 and other insulative materials substantially intact. The wet etching of bulk Co layer 210 may be performed with tetraethyl ammonium hydroxide (TEAH) or similar wet etchant in an example embodiment. As shown in FIG. 14, the wet etching may be performed to preserve a Co layer 212 (FIG. 14 only) over fin(s) 110 adjacent to first portion 120A of gate structure(s) 120. In a further example, Co layer 212 may be positioned horizontally between two gate structures 120. Co layer 212, after being selectively etched, may have a height above fin(s) 110 that is less than that of gate structure(s) 120.

A Co residue 210R (FIG. 14 only) may remain on first portion 120A of gate structure(s) 120 after the wet etching concludes. Co residue 210R may due to metal migration when other portions of bulk Co layer 210 are etched. Co residue 210R thus may be a migration defect on first portion 120A of gate structure(s) 120. Co residue 210R, when present, may be removed after other subsequent processes have been implemented to avoid degradation of Co layer 212 on fin(s) 110. Due to the comparatively smaller thickness of bulk Co layer 210 above STI 140, as shown in FIG.

15, the wet etching may remove bulk Co layer 210 (FIG. 13) over second portion 120B of gate structure(s) 120. Second opening 204 may be re-exposed to its original depth, i.e., the upper surface of second portion 120B of gate structure 120, when the wet etching concludes.

Figure 17:
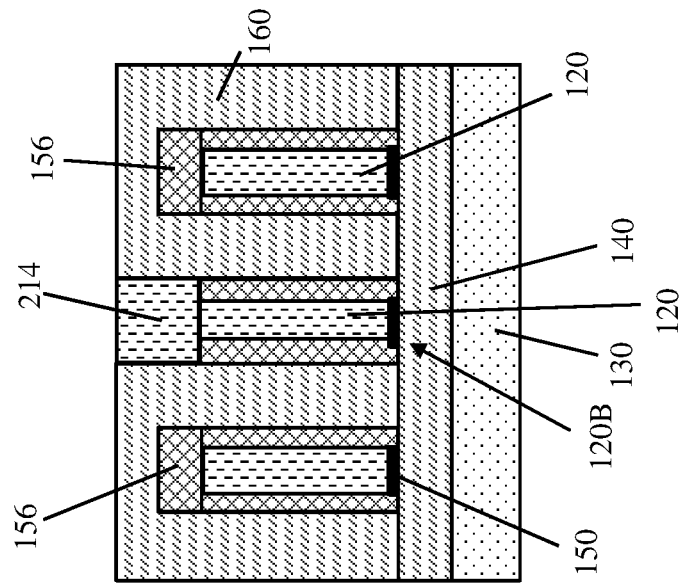
FIG. 17 shows, along the second cross-section, forming an overlying gate metal in the second opening according to embodiments of the disclosure.
Figure 16:
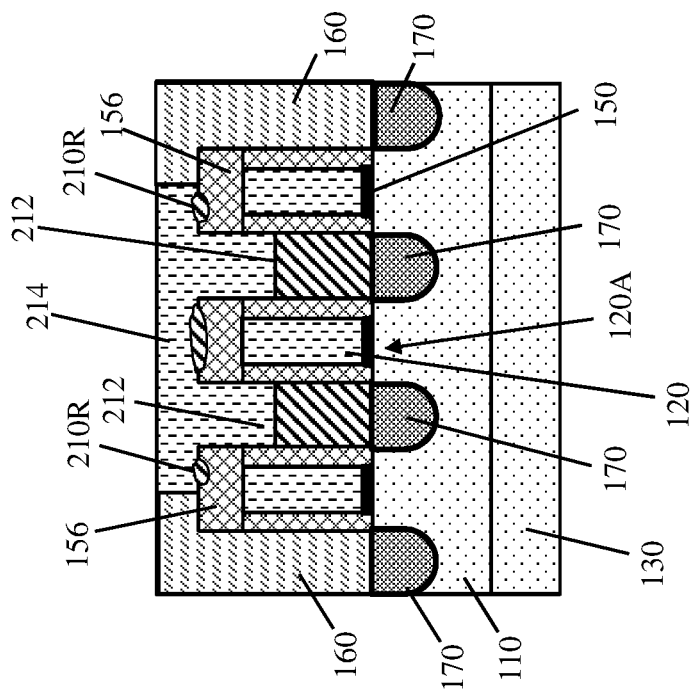
FIG. 16 shows, along the first cross-section, forming an overlying gate metal in the first opening according to embodiments of the disclosure.

Referring now to FIGS. 16 and 17, embodiments of the disclosure may include bulk deposition of a metal layer 214. Materials suitable for use as metal layer 214 may include, e.g., tungsten (W), beryllium (Be), gold (Au), platinum (Pt), palladium (Pt), and/or other high work function metals conventionally formed in metallic portions of a gate structure. Tungsten in particular may be suitable for use as metal layer 214 due to forming a discrete material interface with Co within Co layer 212, and/or other portions of tungsten within second portion 120B of gate structure(s) 120. Metal layer 214 may be formed by deposition followed by etching and/or planarization, such that the upper surface of metal layer 214 is substantially coplanar with the upper surface of oxide 160. Co residue 210R may remain intact on gate structure(s) 120 at first portion 120A, buried underneath metal layer 214.

Figure 19:
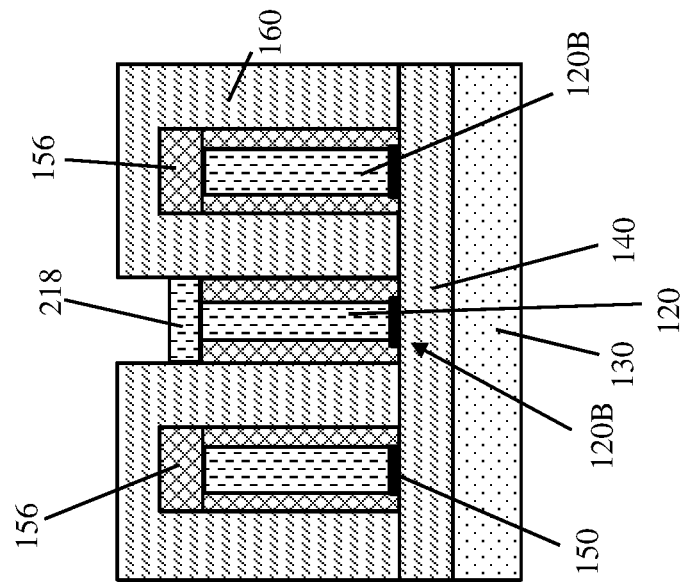
FIG. 19 shows, along the second cross-section, recessing the overlying gate metal over the gate contact region of a gate structure according to embodiments of the disclosure.
Figure 18:
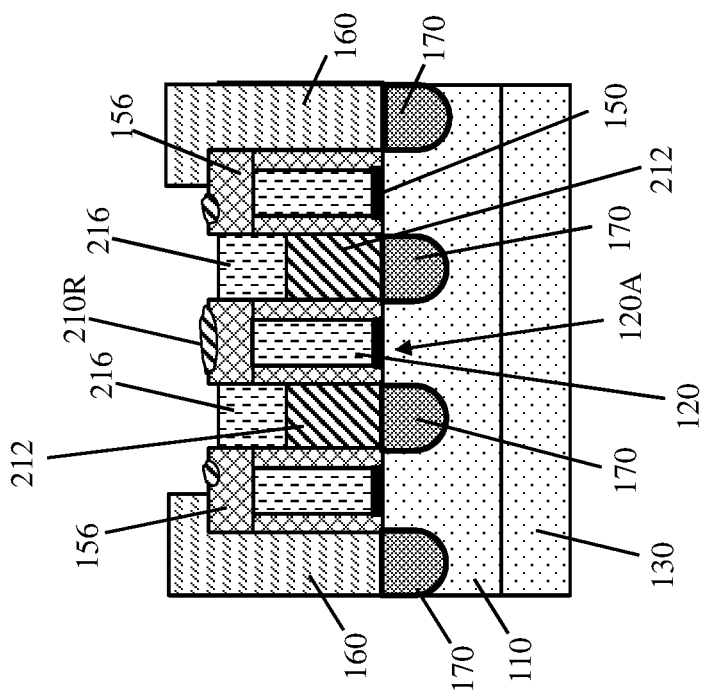
FIG. 18 shows, along the first cross-section, recessing the overlying gate metal to form a metal cap according to embodiments of the disclosure.

Referring to FIGS. 18 and 19, metal layer 214 may be selectively etched to form a metal cap 216 over fin 110 and Co layer 212, and an overlying gate metal 218 on second portion 120B of gate structure(s) 120. The etching to form metal cap 216 and overlying gate metal 218 may be performed with an etchant selective to metal layer 214, without affecting insulative materials and/or metals. The etching of metal layer 214 may not affect Co residue 210R on first portion 120A of gate structure(s) 120, causing CO residue 21OR to remain intact after forming metal cap 216 and overlying gate metal 218. Metal cap 216 and overlying gate metal 218 each may have the same metal(s) included in metal layer 214, as a result of being formed by the etching of metal layer 214.

Figure 21:
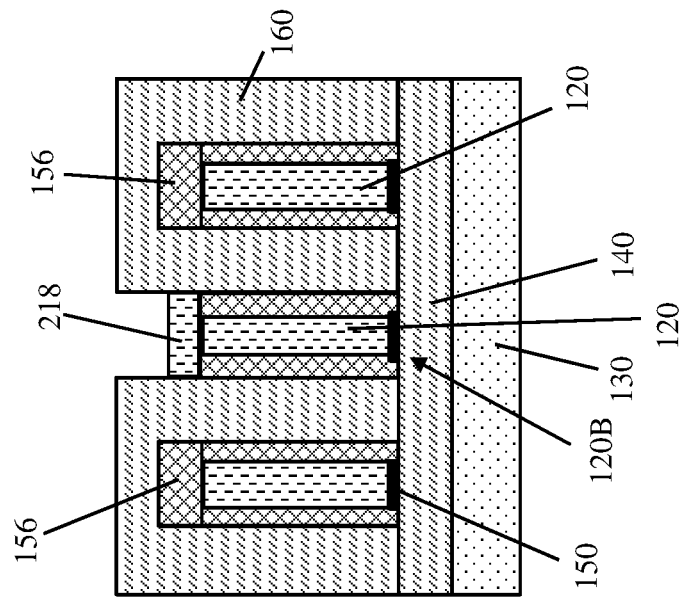
FIG. 21 shows, along the second cross-section, the gate structure at the gate contact region while removing cobalt residue according to embodiments of the disclosure.
Figure 20:
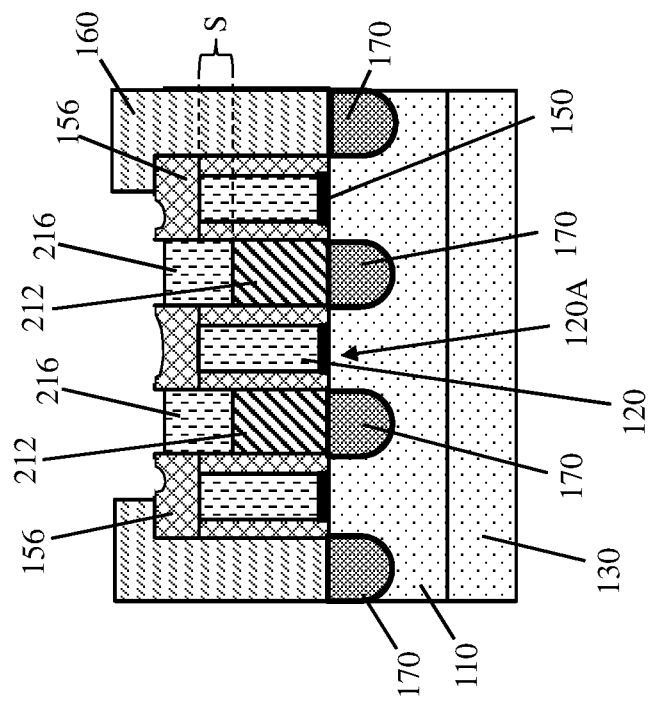
FIG. 20 shows, along the first cross-section, removing cobalt residue according to embodiments of the disclosure.

Referring to FIGS. 20 and 21, the disclosure may include removing excess Co residue 210R (FIG. 18) above metal cap 216 and overlying gate metal 218. It may be impractical to remove Co residue 210R (FIGS. 14, 16, 18) before forming metal cap 216 and overlying gate metal 218. Specifically, removing Co residue 210 R before forming metal cap 216 and overlying gate metal 218 may contaminate, degrade, or remove portions of Co layer 212 from areas where it is desired. Forming metal cap 216 and overlying gate metal 218 as discussed herein, however, covers the previously-formed Co layer 212 and thereby allows Co residue 210R to be removed without affecting Co layer 212 beneath metal cap 216. As shown specifically in FIG. 20, Co residue 210R (FIG. 18) may be removed by wet etching with one or more Co-selective etchants, e.g., phosphoric acid ($H_3PO_4$), to protect metal cap 216, oxide 160, etc. As shown in FIG. 21, the wet etching processes discussed herein may not affect gate structure 120 at second portion 120B, due to the presence of overlying gate metal 218.

After the cleaning of Co residue 210R (FIG. 18) from gate structures 120, other portions of a device may be formed on Co layer 212 and metal cap 216. The relative positions and sizes of Co layer 212, metal cap 216, and gate structure(s) 120 as shown in FIG. 20 may be retained in the eventual IC structure. First portion 120A of gate structure(s) 120 may have an upper surface that is positioned above an upper surface of Co layer 212. That is, gate structure 120 may extend higher above semiconductor fin 110 than the height of Co layer 212 above semiconductor fin 110. A height difference S between gate structure 120 and Co layer 212 indicates that the upper surface of Co layer 212 is below the upper surface of gate structure 120.

Figure 23:
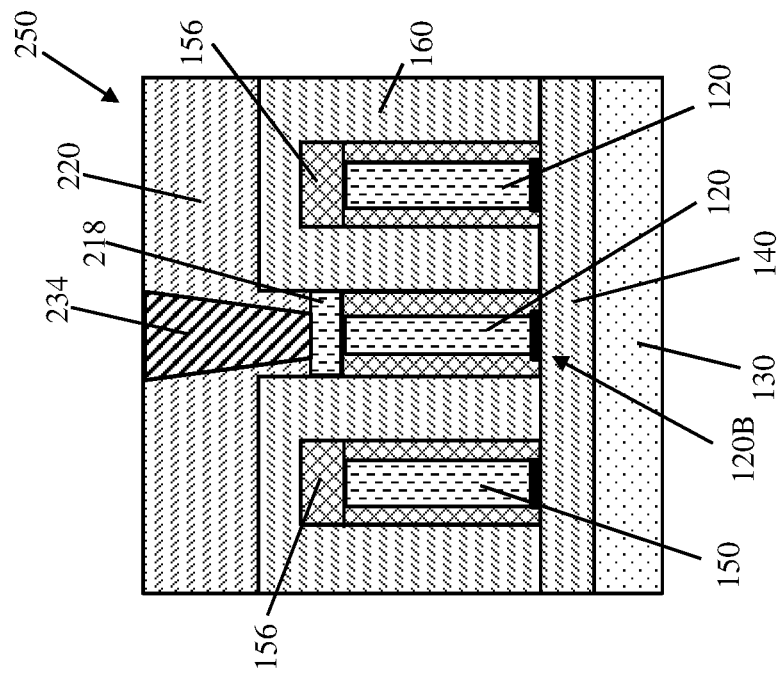
FIG. 23 shows, along the second cross-section, forming the ILD and a gate contact according to embodiments of the disclosure.
Figure 22:
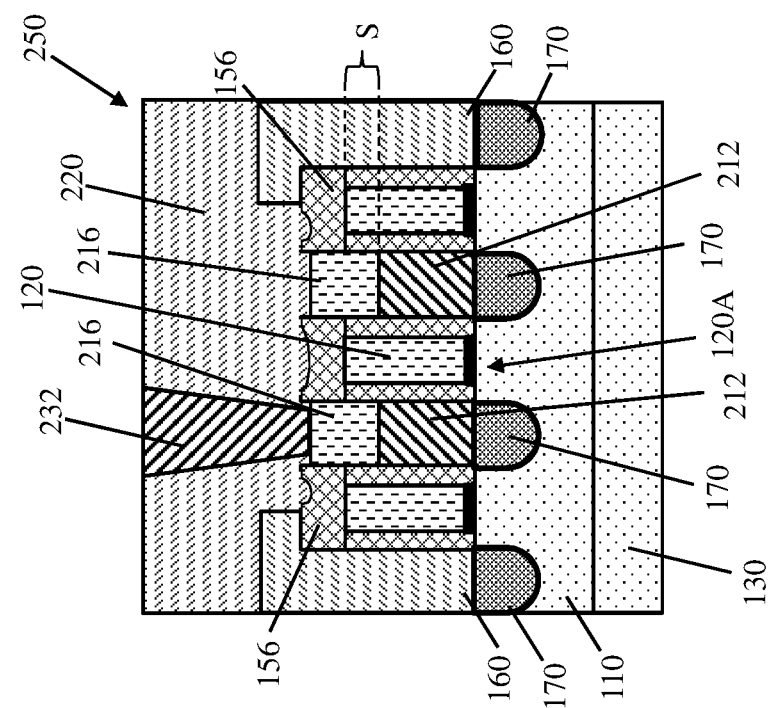
FIG. 22 shows, along the first cross-section, forming an inter-level dielectric (ILD) and source/drain contact according to embodiments of the disclosure.

Turning now to FIGS. 22 and 23, continued processing may include forming interconnect structures to electrically couple fin(s) 110 and gate structure 120 to other circuit elements, e.g., middle-of-line (MOL) or back-end-of-line (BEOL) elements such as metal level wires. An inter-level dielectric (ILD) 220 may be formed above gate structures 120, oxide 160, metal cap 216, overlying gate metal 218, and other previously-formed materials, e.g., by deposition or other techniques of forming an insulative material on a structure. ILD 220 may include the same insulating material as STI(s) 140 (FIG. 23 only), oxide 160, or may include a different electrically insulator material. STI(s) 140, oxide 160, and ILD region 220 nonetheless constitute different components, e.g., due to STI(s) 140 and oxide 160 being formed before ILD 220.

Contacts to overlying circuit elements may be formed using an additional mask (not shown) on predetermined portions of ILD 220 while leaving other materials uncovered, applying a controlled amount of vertical etching to form openings to one or more contact sites, and then filling the openings with a conductor. Such contacts may include, e.g., a first contact 232 extending from, e.g., the top of ILD 220, to metal cap 216 adjacent gate structure 120. A second contact 234 may extend from the top of ILD 220 to overlying gate metal 218 above second portion 120B of gate structure(s) 120. Each contact 232, 234 may include any currently known or later developed conductive material configured for use in an electrical contact, e.g., copper (Cu), aluminum (Al), gold (Au), etc. First and second contacts 232, 234 may additionally include refractory metal liners (not shown) positioned alongside ILD 220 to prevent electromigration degradation, shorting to other components, etc.

Figure 24:
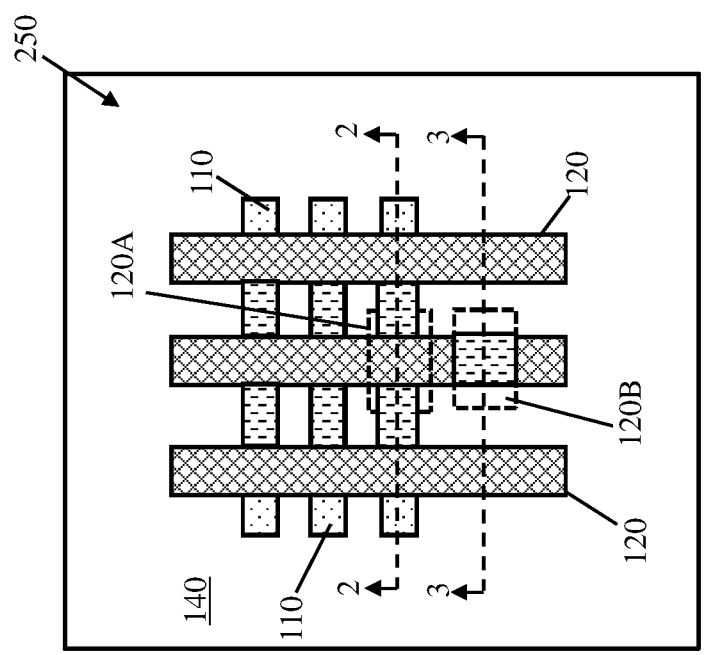
FIG. 24 shows a plan view of an IC structure according to embodiments of the disclosure.

Referring to FIGS. 22-24 together, an IC structure 250 according to embodiments of the disclosure is shown. IC structure 250 may include fin 110 on substrate 140, gate structure 120 over substrate, extending transversely across fin 110 and STI 140. The upper surface of gate structure 120 may remain higher than upper surface of Co layer 212, as indicated by height difference S (FIG. 22) above semiconductor fin 110. In contrast with conventional structures which lack conductive cobalt layers, IC structure 250 includes Co layer 212 on fin 110 adjacent to first portion 120A of gate structure(s) 120. As shown specifically in FIG. 23, gate structure 120 over STI 140 may include overlying gate metal 218 directly on its uppermost surface. First contact 232 may extend through ILD 220 to metal cap 216, while second contact 234 may extend through ILD 220 to overlying gate metal 218. As shown specifically in FIG. 22, metal cap 216 and overlying gate metal 218 may be separated from each other and discontinuous to define respective portions of a transistor structure. Thus, IC structure 250 may be structured and processed to include Co layer 212 with metal cap 218 thereon, preventing any degradation or contamination otherwise associated with including Co in portions of a FinFET transistor structure.

The method as described above may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about," "approximately," and "substantially," are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. An integrated circuit (IC) structure comprising:
a semiconductor fin on a substrate;
a gate structure over the substrate, the gate structure having a first portion extending transversely across the semiconductor fin, wherein the first portion of the gate structure includes a gate metal layer over the semiconductor fin;
an insulator cap positioned on the gate structure above the semiconductor fin;
a cobalt (Co) layer on the semiconductor fin adjacent to the gate structure, wherein an upper surface of the Co layer is below the insulator cap and an upper surface of the gate metal layer; and
a metal cap on the Co layer and adjacent to the insulator cap.

2. The IC structure of claim 1, further comprising:
a shallow trench isolation (STI) laterally adjacent to the semiconductor fin,
a second portion of the gate structure extending transversely across the STI; and
an overlying gate metal directly on an upper surface of the second portion of the gate structure.

3. The IC structure of claim 2, further comprising:
an inter-level dielectric (ILD) region over the insulator cap;
a first contact to the metal cap within the ILD region; and
a second contact to the overlying gate metal within the ILD region.

4. The IC structure of claim 2, wherein the gate structure includes a gate metal and a gate spacer on sidewalls of the gate metal, wherein the overlying gate metal contacts an upper surface of the gate metal and an upper surface of the gate spacer.

5. The IC structure of claim 1, wherein the metal cap includes Tungsten (W) and wherein the tungsten of the metal cap is in contact with a top surface of the cobalt layer.

6. The IC structure of claim 1, wherein the insulator cap includes silicon nitride (SiN), and wherein a portion of the insulator cap includes an indentation extending at least partially into the insulator cap from a top surface thereof.

7. The IC structure of claim 1, wherein the metal cap is positioned directly on an upper surface of the Co layer.

8. An integrated circuit (IC) structure comprising:
a semiconductor fin on a substrate;
a gate structure over the substrate, the gate structure having a first portion extending transversely across the semiconductor fin, wherein the first portion of the gate structure includes a gate metal layer over the semiconductor fin;
an insulator cap positioned on the gate structure above the semiconductor fin, wherein a portion of the insulator cap includes an indentation extending at least partially into the insulator cap from a top surface thereof;
a cobalt (Co) layer on the semiconductor fin adjacent to the gate structure, wherein an upper surface of the Co layer is below the insulator cap and an upper surface of the gate metal layer; and
a metal cap directly on the upper surface of the Co layer and adjacent to the insulator cap.

9. The IC structure of claim 8, wherein the metal cap includes Tungsten (W) and wherein the Tungsten of the metal cap is in contact with a top surface of the cobalt layer.

10. The IC structure of claim 8, wherein the insulator cap includes silicon nitride (SiN).

11. The IC structure of claim 8, further comprising:
a shallow trench isolation (STI) laterally adjacent to the semiconductor fin,
a second portion of the gate structure extending transversely across the STI; and
an overlying gate metal directly on an upper surface of the second portion of the gate structure.

12. The IC structure of claim 11, further comprising:
an inter-level dielectric (ILD) region over the insulator cap;
a first contact to the metal cap within the ILD region; and
a second contact to the overlying gate metal within the ILD region.

13. The IC structure of claim 11, wherein the gate structure includes a gate metal and a gate spacer on at least one sidewall of the gate metal, wherein the overlying gate metal contacts an upper surface of the gate metal and an upper surface of the gate spacer.

14. An integrated circuit (IC) structure comprising:
a semiconductor fin on a substrate;
a shallow trench isolation (STI) laterally adjacent to the semiconductor fin;
a gate structure over the substrate, the gate structure having a first portion extending transversely across the semiconductor fin, wherein the first portion of the gate structure includes a gate metal layer over the semiconductor fin and a second portion extending transversely across the STI;
an overlying gate metal directly on an upper surface of the second portion of the gate structure;
an insulator cap positioned on the gate structure above the semiconductor fin, wherein a portion of the insulator cap includes an indentation extending at least partially into the insulator cap from a top surface thereof;
a cobalt (Co) layer on the semiconductor fin adjacent to the gate structure, wherein an upper surface of the Co layer is below the insulator cap and an upper surface of the gate structure; and
a metal cap on the Co layer and adjacent to the insulator cap.

15. The IC structure of claim 14, further comprising:
an inter-level dielectric (ILD) region over the insulator cap;
a first contact to the metal cap within the ILD region; and
a second contact to the overlying gate metal within the ILD region.

16. The IC structure of claim 15, wherein the gate structure includes a gate metal and a gate spacer on sidewalls of the gate metal, wherein the overlying gate metal contacts an upper surface of the gate metal and an upper surface of the gate spacer.

17. The IC structure of claim 14, wherein the metal cap includes Tungsten (W).

18. The IC structure of claim 17, wherein the insulator cap includes silicon nitride (SiN).

19. The IC structure of claim 18, wherein the metal cap is positioned directly on the upper surface of the Co layer.

* * * * *